(12) United States Patent
Lai (10) Patent No.: US 10,381,340 B2
(45) Date of Patent: Aug. 13, 2019

(54) ELECTROSTATIC DISCHARGE PROTECTION WITH INTEGRATED DIODE

(71) Applicant: NXP B.V., Eindhoven (NL)

(72) Inventor: Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 321 days.

(21) Appl. No.: 15/006,812

(22) Filed: Jan. 26, 2016

(65) Prior Publication Data

US 2017/0213816 A1 Jul. 27, 2017

(51) Int. Cl.
*H02H 9/04* (2006.01)
*H01L 27/02* (2006.01)
*H01L 29/66* (2006.01)
*H01L 29/74* (2006.01)

(52) U.S. Cl.
CPC ...... *H01L 27/0255* (2013.01); *H01L 27/0259* (2013.01); *H01L 29/66371* (2013.01); *H01L 29/7416* (2013.01); *H02H 9/046* (2013.01)

(58) Field of Classification Search
CPC ............. H01L 27/0255; H01L 27/0788; H01L 27/0259; H02H 9/04; H02H 9/046
See application file for complete search history.

(56) References Cited

U.S. PATENT DOCUMENTS

| | | | |
|---|---|---|---|
| 6,064,249 A | 5/2000 | Duvvury et al. | |
| 6,246,079 B1 * | 6/2001 | Chen | H01L 27/0262 257/109 |
| 6,858,902 B1 * | 2/2005 | Salling | H01L 27/027 257/355 |
| 7,582,937 B2 * | 9/2009 | Lai | H01L 27/0262 257/107 |
| 8,432,651 B2 * | 4/2013 | Salcedo | H01L 23/60 257/355 |
| 8,760,831 B2 * | 6/2014 | Abou-Khalil | H01L 27/0262 257/121 |
| 9,153,571 B1 * | 10/2015 | Chen | H01L 27/0251 |
| 9,177,952 B2 * | 11/2015 | Zhan | H01L 27/0262 |
| 9,330,961 B2 * | 5/2016 | Chen | H01L 21/768 |
| 9,627,372 B2 * | 4/2017 | Lai | H01L 27/0255 |
| 9,831,232 B2 * | 11/2017 | Hong | H01L 27/0262 |
| 2004/0052019 A1 * | 3/2004 | Liu | H01L 27/0255 361/56 |

(Continued)

FOREIGN PATENT DOCUMENTS

EP 3107122 A1 12/2016

OTHER PUBLICATIONS

Mergens, "ESD Protection Considerations in Advanced High-Voltage Technologies for Automotive", EOS/ESD Symposium 2006.

(Continued)

*Primary Examiner* — Ronald W Leja
*Assistant Examiner* — Christopher J Clark (57) ABSTRACT

An apparatus can include a first circuit that is configured to provide electrostatic discharge (ESD) protection against an ESD pulse applied between a first node and a second node. The first circuit includes a series stack of bipolar transistors that are configured to shunt current between the first and second nodes in response to the ESD pulse; and a diode connected in series with the stack of bipolar transistors and configured to lower a snapback holding voltage of the first circuit when shunting current between the first and second nodes.

20 Claims, 7 Drawing Sheets

(56) References Cited

U.S. PATENT DOCUMENTS

| | | | |
|---|---|---|---|
| 2004/0085691 A1 | 5/2004 | Ker et al. | |
| 2006/0262471 A1* | 11/2006 | Van Camp | H01L 27/0262 361/56 |
| 2007/0273453 A1* | 11/2007 | Maher | H03K 3/011 331/176 |
| 2008/0029820 A1* | 2/2008 | Disney | H01L 27/0251 257/355 |
| 2010/0044834 A1 | 2/2010 | Park et al. | |
| 2013/0075854 A1* | 3/2013 | Chang | H01L 27/0259 257/477 |
| 2013/0279051 A1* | 10/2013 | Gill | H02H 9/041 361/56 |
| 2014/0035091 A1* | 2/2014 | Smith | H01L 27/0255 257/499 |
| 2014/0049313 A1* | 2/2014 | Lai | H01L 29/7436 327/530 |
| 2014/0167099 A1* | 6/2014 | Mergens | H01L 27/0262 257/109 |
| 2014/0197450 A1* | 7/2014 | He | H01L 27/0248 257/133 |
| 2014/0363930 A1* | 12/2014 | Bobde | H01L 29/866 438/133 |
| 2015/0194808 A1* | 7/2015 | Wang | H01L 27/0259 361/56 |
| 2015/0270708 A1* | 9/2015 | Edwards | H01L 27/0255 361/56 |
| 2016/0094026 A1* | 3/2016 | Coyne | H01L 27/0259 361/17 |
| 2017/0077082 A1* | 3/2017 | Marreiro | H01L 27/0262 |
| 2017/0338222 A1* | 11/2017 | Cline | H01L 27/0255 |
| 2018/0331090 A1* | 11/2018 | de Raad | H01L 27/0248 |

OTHER PUBLICATIONS

AND9006/D Using Transmission Line Pulse Measurements to Understand Protection Product Characteristics, On Semiconductor Application Note, May 2011.

Extended European Search Report for Patent Appln. No. 16206102.2.

Keppens et al., "ESD Protection Solutions for High Voltage Technologies", Conference paper, EOS/ESD Symposium 2004, 12 pages. No Month.

\* cited by examiner

ELECTROSTATIC DISCHARGE PROTECTION WITH INTEGRATED DIODE

OVERVIEW

Aspects of various embodiments are directed to electrostatic discharge (ESD) protection circuitry and to circuitry that includes an integrated diode for setting a snapback holding voltage or other properties.

Electrostatic discharge (ESD) is the sudden flow of electricity that can be caused by a buildup of static electricity between two devices that come into electrical contact. An ESD event can occur when the objects are close enough for the dielectric between them to break down. ESD events are the cause of many failures for integrated circuit (IC) devices and chips. ESD protection can be provided using a variety of different circuit solutions. The operating characteristics for ESD protection can be limited by the IC chip space, manufacturing process and costs, and technology limitations. As device capabilities change, ESD protection technology solutions may cease to be capable of matching the device capabilities.

These and other matters have presented challenges to efficiencies of ESD protection implementations, for a variety of applications.

SUMMARY

Various embodiments are directed toward an electrostatic discharge (ESD) protection circuit that, when in off-state, does not conduct (primarily only junction leakage current) between two nodes. The ESD protection device includes a series stack of bipolar transistors and a diode. In response to an ESD event, a trigger current conducts through series stack of bipolar transistors and a diode. An embedded silicon controlled rectifier (eSCR) can be activated in response to the trigger current creating a trigger voltage event (e.g., once substrate receives enough current to activate the diode PN junction. Current is then shunted through the series stack of bipolar transistors and the diode.

Various example embodiments are directed toward an apparatus that includes a first circuit that is configured to provide electrostatic discharge (ESD) protection against an ESD pulse applied between a first node and a second node. The first circuit can include a series stack of bipolar transistors that are configured to shunt current between the first and second nodes in response to the ESD pulse. The first circuit can also include a diode that is connected in series with the stack of bipolar transistors. The connection of the diode can result in a configuration that lowers a snapback holding voltage of the first circuit when shunting current between the first and second nodes, relative to a configuration that does not include the diode.

According to some embodiments of the present disclosure, a method is followed in which an electrostatic discharge (ESD) pulse is received on a first node. In response to the ESD pulse and while the ESD protection circuit is in an off-state, a trigger current can be passed through a trigger path within an ESD protection circuit that includes a series stack of bipolar transistors and a diode that is connected in series with the series stack of bipolar transistors. In response to the trigger current, the ESD protection circuit can transition to an on-state by enabling an embedded silicon controlled rectifier (eSCR) component that includes a combination of a particular bipolar transistor from the series stack of bipolar transistors and the diode. In response to transitioning to the on-state, current from the ESD pulse can be shunted through the series stack of bipolar transistors and the diode.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving ESD protection. In certain implementations, aspects of the present disclosure have been shown to be beneficial when used in the context of ESD protection for relatively high voltage nodes. In some embodiments, the ESD protection can include an embedded silicon controlled rectifier (eSCR) component that facilitates use with high voltage nodes. These and other aspects can be implemented to address challenges, including those discussed in the background above. While not necessarily so limited, various aspects may be appreciated through a discussion of examples using such exemplary contexts.

Various embodiments of the present disclosure are directed toward a series stack of bipolar (PNP-based) transistors that can be particularly useful for high voltage applications (e.g., 20V, 30V, or even higher). Particular embodiments are directed toward an area-efficient and latch-up immune PNP-eSCR (PNP-embedded SCR) ESD protection circuit with both tunable trigger voltage and snapback holding voltage for high voltage applications. Such ESD protection properties can be particularly useful in view of the small ESD design window for high voltage drivers.

As discussed herein, the ESD design window defines the acceptable operational parameters for the ESD protection circuit. More particularly, the ESD design window can be set such that the ESD protection circuit is activated (the trigger voltage) at a voltage that is below a voltage at which the device under protection is permanently damaged (the failure voltage of the device). The ESD design window can also be set to avoid latch up conditions by ensuring that the snapback holding voltage of the ESD protection circuit is above the operating voltage of the device being protected. For instance, if the ESD protection circuit might operate in a 30 V voltage domain, the ESD design window can specify a snapback holding voltage that is above 30 V. If the device being protected suffers failure above 40V, then the trigger voltage should be less than 40V. The amount that the snapback holding voltage is above the operating voltage can be increased to provide margin (e.g., to account for slight differences in caused by processing variations). A similar margin can be implemented for the trigger voltage relative to the device failure voltage.

Embodiments of the present disclosure are directed toward the use of a bipolar transistor and diode series combination that operates as an eSCR. Thus, once the trigger voltage has been reached for the ESD protection circuit, the eSCR component can enter a conducting (on) state. The ESD protection circuit can then exit the conducting state (turn off) once the holding current drops below a threshold value. In the conducting state, the eSCR functions with a low voltage drop and low on resistance (relative to a PNP transistor alone). The low voltage drop can be particularly useful for creating an ESD protection circuit with a reduced snapback holding voltage, relative to a similar ESD protection circuit using a stacked bipolar transistor configuration without an eSCR formed by a transistor and series diode combination.

According to various embodiments, the bipolar transistors can be created in connection with complementary metal-oxide semiconductor (CMOS) manufacturing processes and structures, where the bipolar transistors are formed from parasitic components within the CMOS structures.

Figure 1:
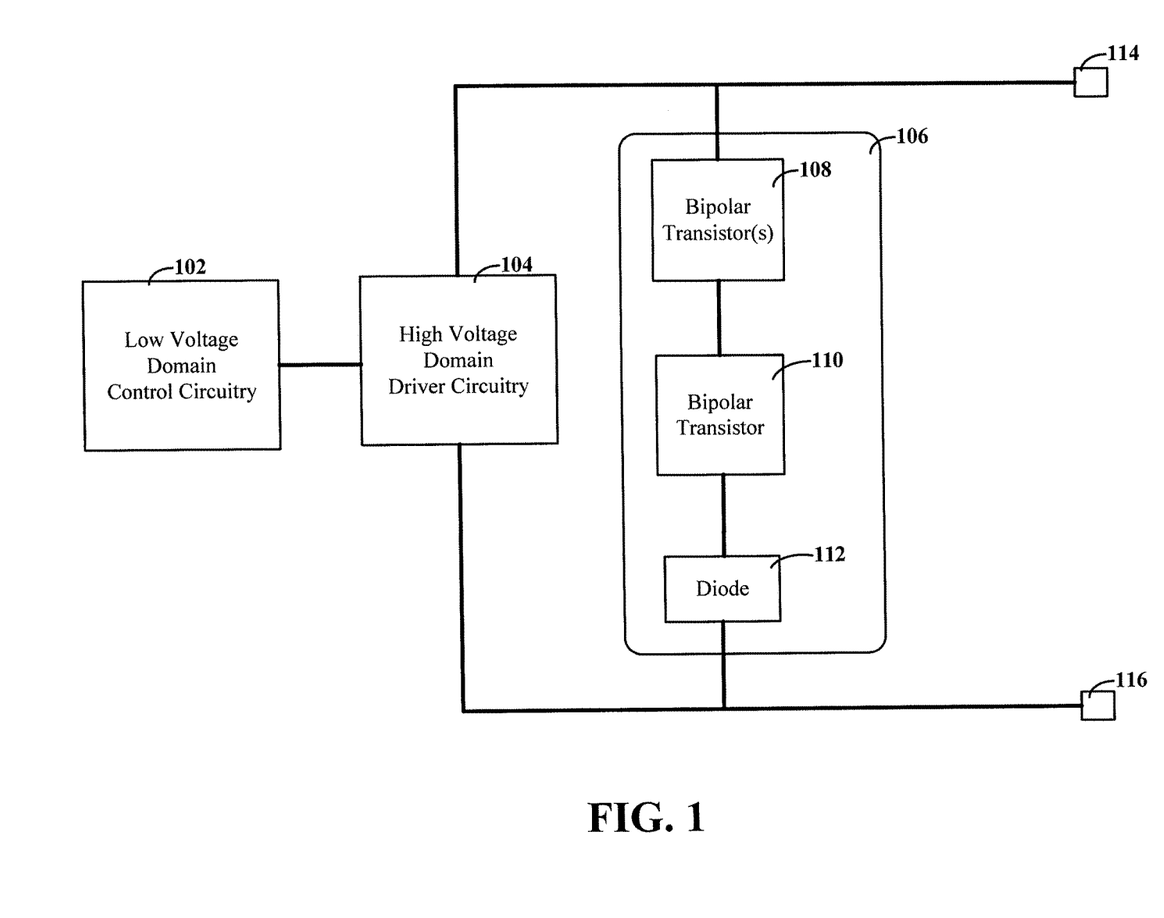
FIG. 1 depicts a block diagram for a system that includes an ESD protection circuit, consistent with embodiments of the present disclosure.

Turning now to the figures, FIG. 1 depicts a block diagram for a system that includes an ESD protection circuit, consistent with embodiments of the present disclosure. The system can include control circuitry 102 that is linked to driver circuitry 104. Driver circuitry 104 can be configured to drive nodes 114 and 116, and nodes 114 (positive node) and 116 (ground/negative node) can be at risk for ESD events. For example, the control circuitry 102 and the driver circuitry 104 can be located on a common substrate (e.g., as part of an IC chip) and nodes 114 and 116 can be electrically connected to externally accessible pads or pins. In certain implementations, the control circuitry 102 can operate in one or more low voltage domains (e.g., under 5 V) while driver circuitry 104 can operate in a relatively high voltage domain (e.g., 20 volts or more).

Aspects of the present disclosure recognize that ESD protection for a relatively high voltage domain can be difficult due to properties of the circuitry components used to provide the ESD protection. For instance, an ESD protection circuit made from two stacked PNP transistors is estimated to not be sufficient to meet the requirements of driver circuitry operating at 25V. More particularly, the effect of a positive ESD pulse on nodes 114 and 116 was experimentally tested using 100 ns transmission line pulse (TLP) characteristics of a series stack of 2 PNPs (500 μm wide for each with emitter/base abutted layout style to achieve a small snapback behavior). The testing assumed a 25V driver (1000 μm wide) with gate voltage ($V_G$)=0V and 5V. The results suggest that such a series stack of PNPs would not be able to provide adequate protection above 0.6 A of TLP current. The ESD design window was only 6V ($V_{BD}$=25V<ESD design window <$V_{fail}$=31V), therefore 2 kV human body model (HBM) (~1 A TLP) was not met. Decreasing the on-resistance of the protection by making it wider is not believed to be of much use in this context. It has been recognized that a reduction in the snapback holding voltage can be used to help meet the ESD design windows for high voltage driver circuits.

Various aspects of the present disclosure are directed toward an ESD protection circuit 106 that is configured to reduce the snapback holding voltage relative to a series stack of bipolar transistors. The ESD protection circuit 106 includes a series stack of bipolar transistors 108, 110. The bipolar transistor(s) 108 can include one or more bipolar transistors connected in series. The number of transistors can be selected based upon the circuit and device that is being protected. For instance, adding additional bipolar transistors can increase the voltage at which ESD protection is provided. This can include increasing both the trigger voltage and snapback holding voltages.

As used herein, the series connection for the stack of bipolar transistors 108, 110 is such that, when the bipolar transistors are on (conducting), current shunted between nodes 114, 116 sequentially passes through the emitter and collector of each of the bipolar transistors. According to embodiments of the present disclosure, the ESD protection circuit 106 includes an integrated diode 112. The integrated combination of the bipolar transistor 110 and diode 112 is configured to provide a reduced snapback holding voltage relative to when the diode 112 is not present. In particular embodiments, the combination of the bipolar transistor 110 and diode 112 are configured to operate as an eSCR, such that the combination has a low voltage drop when shunting current from a potentially harmful ESD event.

Figure 2:
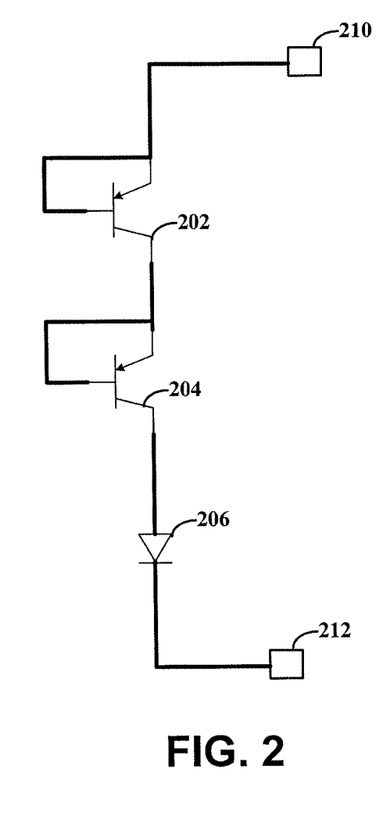
FIG. 2 shows a circuit diagram for an ESD protection circuit that is configured with an eSCR component, consistent with embodiments of the present disclosure.

FIG. 2 shows a circuit diagram for an ESD protection circuit that is configured with an eSCR component, consistent with embodiments of the present disclosure. The circuit depicted in FIG. 2 is consistent with one or more embodiments of FIG. 1, and in particular, with one or more embodiments of the ESD protection circuit 106 of FIG. 1. The base and emitter of PNP transistor 202 can be connected to node 210, which can be a positive voltage node, such as node 114 from FIG. 1. The collector of PNP transistor 202 can be connected to the base and emitter of PNP transistor 204. The collector of PNP transistor 204 can then be connected to the anode of the PN diode 206. The cathode of the PN diode can then be connected to node 212, which can be a negative or ground voltage node, such as node 116 from FIG. 1.

Consistent with various embodiments, one or more additional PNP transistors 202 can be added in series. For instance, additional PNP transistors 202 can be added in order to increase the trigger and snapback holding voltages relative to the operating voltage of the circuit and device being protected.

When a positive ESD pulse is applied to node 210; the ESD protection circuit will shunt the ESD current from node 210 to node 212 if the ESD pulse exceeds the trigger voltage of the ESD protection circuit. The trigger voltage corresponds to an avalanche breakdown condition in the circuit components of the ESD protection circuit. The ESD protection circuit can turn on due to part of the impact ionization current in the collector of the lower PNP 204 reaching the substrate of the device and leaving through a corresponding substrate contact. This creates a potential/voltage difference in the substrate relative to the cathode of the diode. When the potential difference is large enough, an NPN region (formed between two Ndrift regions of the diode 106 and transistor 204) will turn-on. Once turned on, the combination of the diode 206 and PNP transistor 204 form an SCR, which results in a reduced snapback holding voltage. It is noted that diode 206 raises the trigger voltage by around 1V, e.g., due to a forward diode voltage drop that is present before the NPN region is turned on. According to certain embodiments, the triggering voltage can be extended by adding one or more additional diodes in series between the diode 206 and node 212. For instance, a stack of two PNP transistors with 4 total series diodes can result in a triggering voltage that is above 30 V. The additional diodes can take up less area when compared to adding additional PNP transistors; however, it is recognized that the use of such diodes can result in higher leakage currents.

Figure 3A:
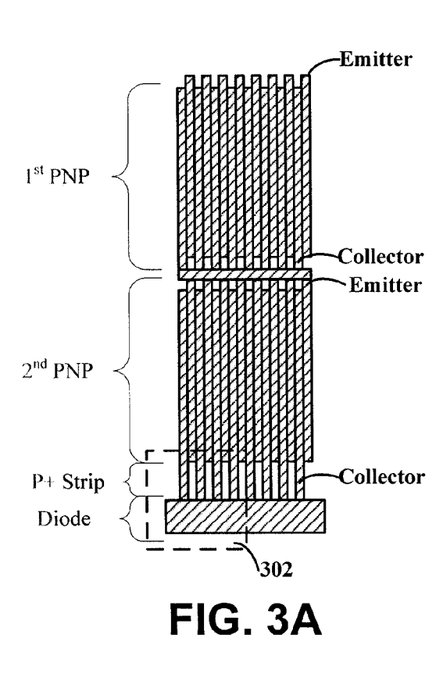
FIG. 3A depicts a layout view of a series stack of PNP transistors, consistent with embodiments of the present disclosure.

FIG. 3A depicts a layout view of a series stack of PNP transistors, consistent with embodiments of the present disclosure. The layout view shows a series connection of first and second PNP transistors and a diode. The layout view also shows a location of an optional P+ strip that can be used to facilitate current conduction when the eSCR is in the on state. The layout depicts a number of alternating collector and emitter strips that show how the emitters and cathodes are electrically connected to each other and to other circuit components. Various embodiments can include different numbers of such strips. The emitter and collector stripes of each PNP transistor can be surrounded by a corresponding base ring (not depicted in FIG. 3A). In this manner, the emitter that is connected to the source of ESD events can be located inside of the base ring. The benefits of adding extra P+ strip can include the creation of a smooth SCR path, as a result, lower voltage drop will be achieved while the ESD protection circuit is active. Accordingly, for a low operating voltage (e.g., around 16V), the extra P+ strip can lower the snapback holding voltage, without scarifying total structure size. It is recognized that while the particular use of P+ strip is relevant for the depicted layout topology, different layout topologies will result in different ESD performance characteristics that can be used with other variations and layout solutions.

Figure 3B:
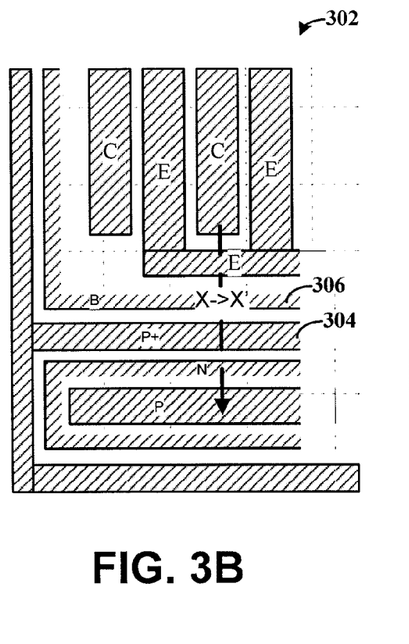
FIG. 3B depicts an enlarged view of the doping within section 302 from FIG. 3A, consistent with embodiments of the present disclosure.

FIG. 3B depicts an enlarged view of the doping within section 302 from FIG. 3A, consistent with embodiments of the present disclosure. To facilitate current flow for an eSCR path, an extra P+ strip 304 can be inserted between the $2^{nd}$ PNP and the base ring 306, as shown in FIG. 3(c). In certain embodiments, the extra P+ strip is electrically connected to the emitter of the $2^{nd}$ PNP through a wiring layer. According to embodiments, the PNP transistors can each be configured with a gap between the emitter and base. This non-abutted emitter/base layout style can be useful for decreasing the snapback holding voltage, relative to an abutted emitter/base layout style. For instance, the gap between the base and emitter can introduce a large N-type well resistance that results in a smaller snapback holding voltage.

According to some embodiments, a P+ region 304 can also surround the base 306 of the PNP transistors. The P+ region 304 can be used as a P-well-blocking layer between the bases of the PNP transistors and the p-well in the substrate. This can be particularly useful for preventing DC breakdown from the base to the substrate. It is recognized that this P+ region blocking layer can be left out of the current path within the eSCR. This can be useful for providing a faster response for the eSCR relative to if the P-well blocking layer is present in the current path.

Figure 3C:
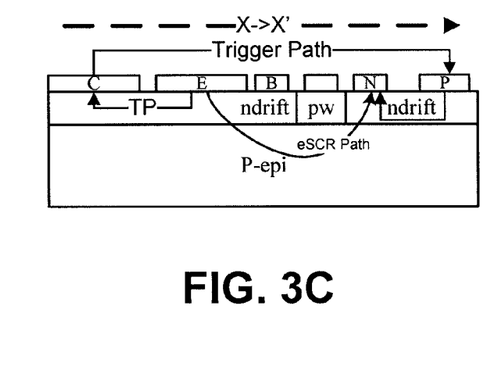
FIG. 3C depicts a cross sectional view of the layout from FIG. 3B at the location indicated by the dashed arrow from X to X', consistent with embodiments of the present disclosure.

FIG. 3C depicts a cross sectional view of the layout from FIG. 3B at the location indicated by the dashed arrow from X to X', consistent with embodiments of the present disclosure. During a positive ESD event, a triggering mechanism will occur when the ESD voltage is high enough to trigger the PNPs. This mechanism includes ESD current that flows sequentially through the series connected PNP devices and through the PN diode. The path through the lower PNP and diode is indicated by the arrows labelled Trigger Path or just "TP." This path flows from the emitter (E) to the collector (C) through the ndrift region. While the depicted embodiments show an ndrift region, various embodiments allow for different type of n-type well regions. For instance, Table 1 below and the corresponding discussion allow for different doping concentrations to be used to create corresponding n-type well regions.

The collector is connected to the anode (P) of the diode. From the anode, the current goes through the ndrift region to the cathode (N). According to various embodiments, the collector of the $2^{nd}$ PNP can be electrically connected to the anode (P portion) of the PN diode using a trace in a wiring layer.

The trigger mechanism causes part of the impact ionization current in the collector of the lower PNP to reach the substrate and to leave through a substrate contact. When a sufficient potential difference builds up between the P-substrate (P-sub) and the cathode (N) of the diode, the eSCR component will begin conducting through the current path labelled as the eSCR path in FIG. 3C.

Experimental testing suggests that the trigger mechanisms of a PNP-eSCR consistent with FIG. 3 is determined by the $2^{nd}$ PNP and the diode. In particular, the eSCR is activated just after snapback to shunt the main ESD current. This finding was supported by the corresponding impact ionization and the current distribution for both before eSCR triggering and just after eSCR triggering.

Figure 4:
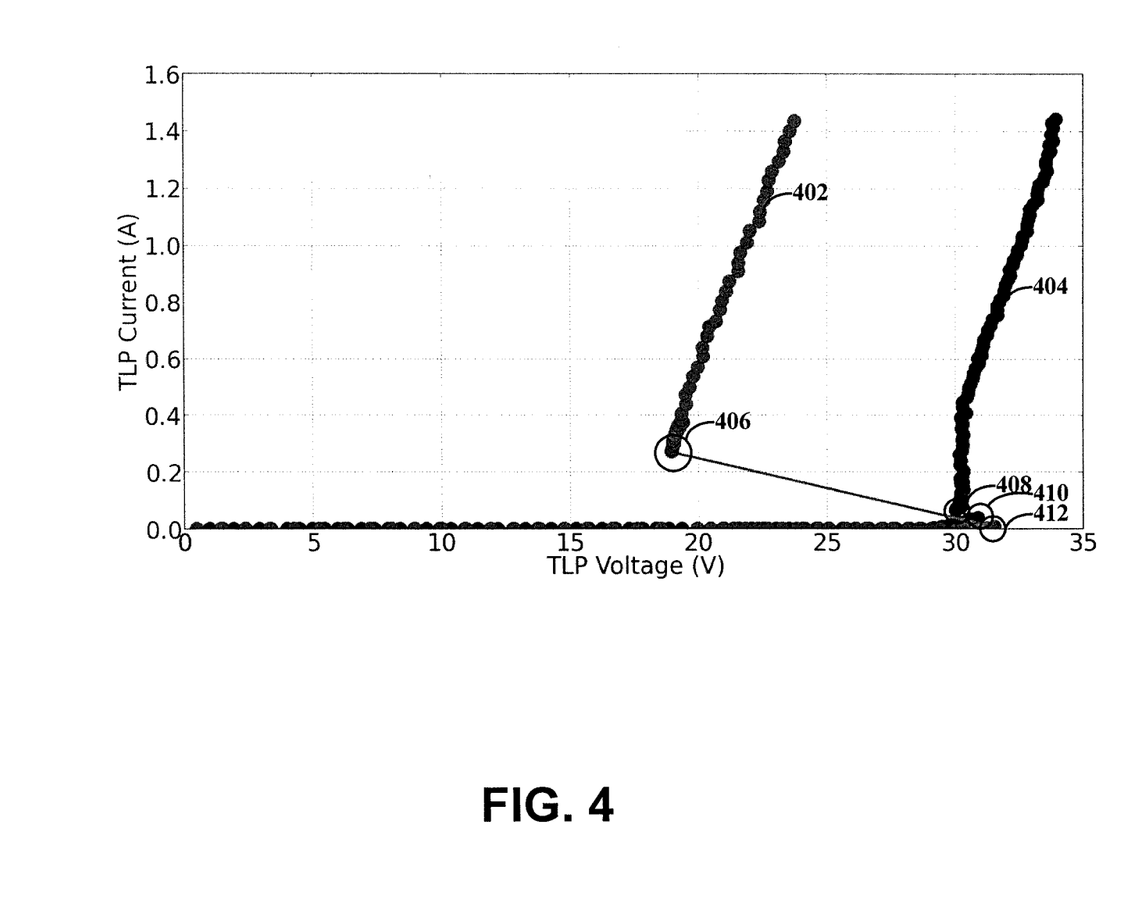
FIG. 4 shows a graph for TLP measurements of a two-stack PNP ESD protection circuit and a two-stack PNP-eSCR ESD protection circuit, consistent with embodiments of the present disclosure.

FIG. 4 shows a graph for TLP measurements of a two-stack PNP ESD protection circuit and a two-stack PNP-eSCR ESD protection circuit, consistent with embodiments of the present disclosure. The testing was carried out using 100 ns TLP characteristics. The trace 404 for the two-stack PNP ESD protection circuit shows a snapback holding voltage 408 of around 30V. In comparison, the trace 402, of the two-stack PNP-eSCR ESD protection circuit shows a snapback holding voltage 406 of under 20V, which is consistent with the expected eSCR response. The trigger voltages 410 and 412 were each slightly over 30V, with the trigger voltage 412 of the two-stack PNP-eSCR ESD protection circuit being above (~1V) the corresponding trigger voltage 410 of the two-stack PNP ESD protection circuit.

This voltage differential is believed to be the result of the additional diode in the two-stack PNP-eSCR ESD protection circuit.

Various embodiments are directed toward the use of different dopant variants to tune the trigger voltage ($V_{t1}$) and breakdown voltage ($V_{BD}$). For example, the trigger voltage and breakdown voltages can each be increased by reducing the doping in the N-base portion of the PNP transistors. Table 1 shows examples of breakdown voltages and trigger voltages for different doping concentration.

TABLE 1

Tunable trigger voltage ($V_{T1}$) variants

| Variants | N-base of PNP device | $V_{BD}(V)$@1 nA | $V_{T1}(V)$ |
|---|---|---|---|
| (A) | Heavily doped | 25 | 28 |
| (B) | Medium doped | 27 | 30 |
| (C) | Lightly doped | 29 | 31 |

Certain embodiments of the present disclosure are directed toward the use of one or more adjustable parameters and configurations that can change the snapback holding voltage ($V_H$). Three such parameters that can result in an increased snapback holding voltage are to: remove the extra horizontal P+ strip; make the emitter/base abutted for both PNPs; and increase the PN space from the emitter of the lower PNP to the cathode of the diode. These parameters can be used alone or in various combinations. Table 2 shows a comparison of a few such combinations.

TABLE 2

VH comparison summary table

| ESD device lists | Emitter/Base of PNP (abutted or non-abutted) | Extra P+ stripe in between the 2nd PNP and base ring | PN space(um) | VH(V) |
|---|---|---|---|---|
| Pure 2 stack PNPs | abutted | not applicable | not applicable | 28.7 |
| A 2 stack of 1 PNP and 1 PNP-eSCR | non-abutted | Yes | 2.5 | 17.8 |
| A 2 stack of 1 PNP and 1 PNP-eSCR | abutted | No | 5.0 | 24.5 |
| | | | 6.0 | 25.3 |
| | | | 7.0 | 26.0 |

Figure 5:
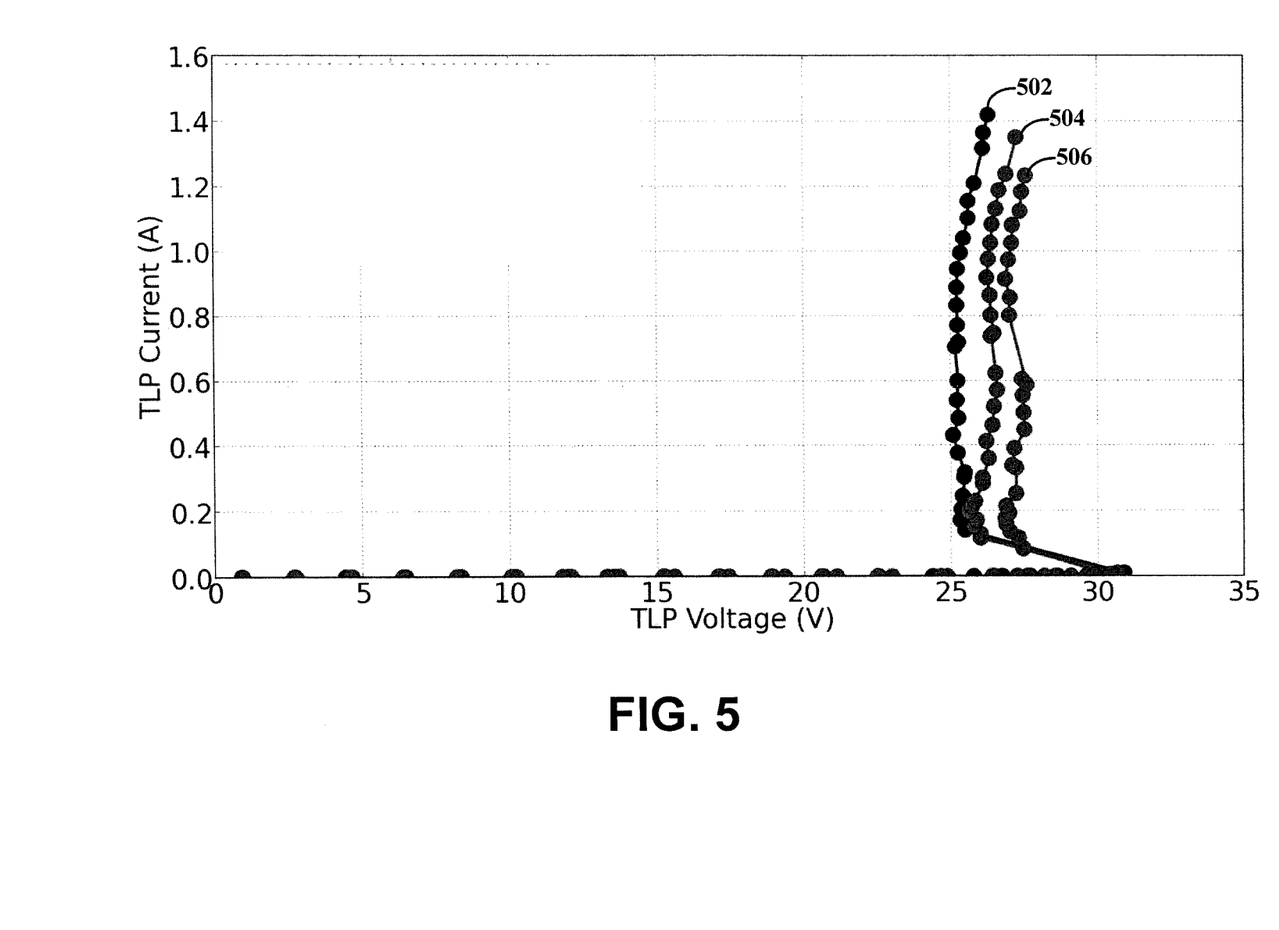
FIG. 5 shows a graph for TLP measurements of two-stack PNP-eSCR ESD protection circuits with different physical spacing between components of the eSCR, consistent with embodiments of the present disclosure.

FIG. 5 shows a graph for TLP measurements of two-stack PNP-eSCR ESD protection circuits with different physical spacing between components of the eSCR, consistent with embodiments of the present disclosure. According to various embodiments of the present disclosure, the snapback holding voltage ($V_H$) can be adjusted by changing the PN spacing between the emitter of the lower PNP to the cathode of the diode, where a larger space results in an increase in the snapback holding voltage. Traces 502, 504, and 506 show the TLP characteristics for a PN spacing of 5 μm, 6 μm and 7 μm, respectively. The last point in the respective traces represents the thermal limit ($I_{t2}$) for the corresponding circuit. It is recognized that increasing the snapback holding voltage can result in a slight decrease to the thermal limit and corresponding current ($I_{t2}$).

Somewhat surprisingly, it has been recognized that the thermal limit ($I_{t2}$) can be significantly higher for the PNP transistor that is part of the eSCR component. This is believed to be due to the higher failure current density resulting from the eSCR current conduction path in the on state. This property can therefore be used to improve area used by the ESD protection circuit relative to the $I_{t2}$ value (e.g., as expressed in $I_{t2}$/area (mA/μm$^2$)). As shown in Table 3, an increase in the width of the 1$^{st}$ PNP transistor, for a stack of 2 PNP transistors, results in a corresponding increase in the $I_{t2}$ value. The same was not found to be true for an increase in the size of the width of the 2$^{nd}$ PNP transistor.

TABLE 3

ESD current capability (IT2) versus the size of PNPs

| Variants in FIG. 3(a) | W1 of the 1st PNP(um) | W2 of the 2nd PNP(um) | PN space(um) | $I_{T2}(A)$ |
|---|---|---|---|---|
| A | 500 | 500 | 2.5 | 1.4 |
| B | 750 | 500 | 2.5 | 1.9 |
| C | 500 | 750 | 2.5 | 1.4 |

Consistent with various embodiments, additional PNP transistors can be added to the stack in order to increase the trigger voltage and snapback holding voltage. The configuration and layout of the stacked PNP transistors can be adjusted using the various techniques discussed herein to further refine the trigger voltage and snapback holding voltage. As an example, a three stack PNP transistor, with one PNP functioning as a PNP-eSCR, can be designed for use with a driver circuit that designed for use with 30V operating voltage and that has a failure voltage of 40V or higher. TLP characterizations suggest that such a configuration can be used to achieve a trigger voltage that exceeds 30 V (e.g., 39 V) and a snapback holding voltage of around 35 V. The tunable characteristics identified herein can be used to adjust the trigger voltage and snapback holding voltage relative to this specific example. For instance, experimental testing suggests that a trigger voltage of between 40 V and 50 V can be achieved in combination with a snapback holding voltage of around 37 V. Other combinations of trigger voltages and snapback holding voltages can also be achieved.

Figure 6:
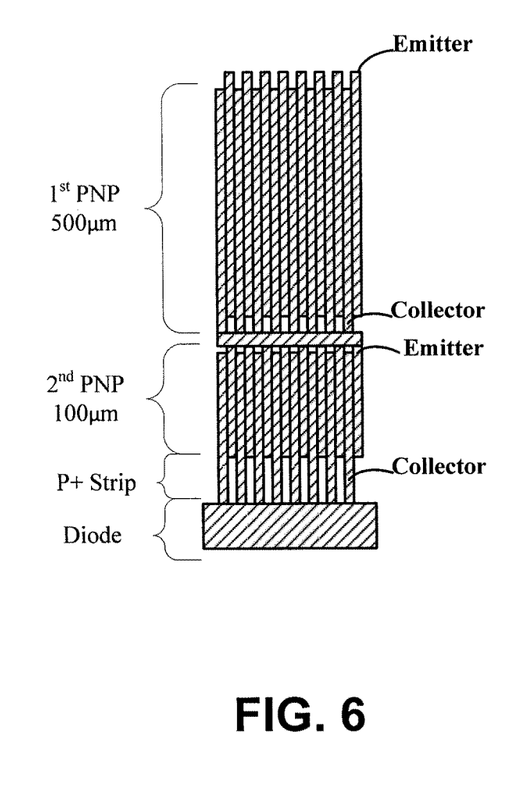
FIG. 6 depicts a layout view of a series stack of PNP transistors with a reduced size for a PNP transistor that forms part of the eSCR component, consistent with embodiments of the present disclosure.

FIG. 6 depicts a layout view of a series stack of PNP transistors with a reduced size for a PNP transistor that forms part of the eSCR component, consistent with embodiments of the present disclosure. In the layout shown in FIG. 6, the width of the 2$^{nd}$ PNP transistor has been reduced to 100 μm, which is ⅕ of the width of the 1$^{st}$ PNP transistor (500 μm). The $I_{t2}$ value for the layout of FIG. 6 was found to be virtually the same as the $I_{t2}$ value for a layout in which the widths of the PNP transistors were the same. Accordingly, various embodiments can be particularly useful for improving area efficiency by reducing the width of the PNP transistor that is part of the eSCR component (relative to other PNP transistor(s) in the transistor series-stack). Without being limited by theory or specific manufacturing process, the relative efficiency ($I_{t2}$/area) can be improved by as much as 60% relative to a non-eSCR stacked PNP transistor solution.

The particular test results provide a basis for relative comparisons of the corresponding features (e.g., relative values for $I_{t2}$ or $V_H$). These test results, however, do not necessarily limit any particular embodiments to the specific values found in the test results. For instance, the particular transistor layout sizes, doping concentrations, and underlying manufacturing processes can change the specific values found in these test results.

Figure 7:
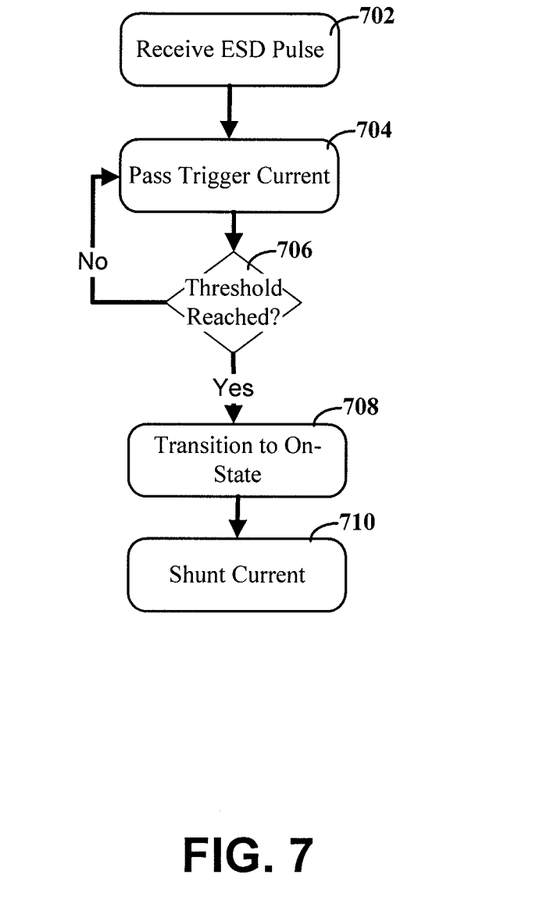
FIG. 7 shows a flow diagram for shunting ESD current, consistent with embodiments of the present disclosure.

FIG. 7 shows a flow diagram for shunting ESD current, consistent with embodiments of the present disclosure. The flow begins when an electrostatic discharge (ESD) pulse is received on a first node that is connected to an ESD protection circuit, per block 702. As discussed herein, this node can be a positive node that is driven by a high voltage driver circuit. In some embodiments, the node can be located on an IC chip and can be exposed to potential ESD pulses through external connections, such as contact pads, wire bonds, and similar connection points. When an ESD pulse is present on the second node, it can cause a trigger current to flow, per block 704. The trigger current can include impact ionization current in the collector of a bipolar transistor that is part of an eSCR component. Thus, a trigger current can be passed through a trigger path within the ESD protection circuit. In various embodiments of the present disclosure, the trigger path through which the trigger current flows can pass through a portion of a bipolar transistor in a series stack of bipolar transistors to a diode that is connected in series with the series stack of bipolar transistors. More particularly and as shown in FIG. 3C, a first portion of the trigger path can pass through a drift region and can flow from an emitter of the particular bipolar transistor to a collector of the particular bipolar transistor. A second portion of the trigger path can flow between the collector of the particular bipolar transistor and an anode of the diode. This second portion can include one or more electrically conductive traces with low resistances.

The trigger current can cause a voltage potential to form in the substrate relative to the cathode of the diode. If the voltage potential does not exceed a threshold, the ESD protection circuit can remain off and trigger current can continue to pass until either the ESD pulse dissipates or the potential exceeds a threshold level, per block 706. If the voltage potential exceeds a threshold, then an NPN region (formed between two Ndrift regions of the diode and bipolar transistor) can turn-on. This results in the ESD protection circuit transitioning, in response to the trigger path, to an on-state, per block 708. In particular, the transition can include enabling an eSCR component to conduct current through a current path, such as the eSCR path depicted in the FIG. 3C. According to embodiments, the eSCR component can include a combination of a particular bipolar transistor from the series stack of bipolar transistors and the diode. The ESD protection circuit can then begin shunting current, per block 710, in response to transitioning to the on-state, current from the ESD pulse through the series stack of bipolar transistors and the diode. This shunting can continue until the voltage and current provided by the ESD pulse drop below the respective holding values for the ESD protection circuit.

Based upon the above discussion and illustrations, those skilled in the art will readily recognize that various modifications and changes may be made to the various embodiments without strictly following the exemplary embodiments and applications illustrated and described herein. For example, an apparatus can include bipolar transistors with different layout patterns and configurations than illustrated by the figures. Such modifications do not depart from the true spirit and scope of various aspects of the invention, including aspects set forth in the claims.

What is claimed is:

1. An apparatus comprising:
a first circuit configured to provide electrostatic discharge (ESD) protection against an ESD pulse applied between a first node and a second node, the first circuit including:
a series stack of bipolar transistors that are configured and arranged between the first and second nodes to shunt current between the first and second nodes in response to the ESD pulse; and
a diode connected in series with the stack of bipolar transistors and between the first and second nodes, and configured to lower a snapback holding voltage of the first circuit when shunting current between the first and second nodes, wherein a combination of a particular bipolar transistor from the series stack of bipolar transistors and the diode, which are respectively connected in series, form a circuit including an embedded silicon controlled rectifier (eSCR) configured and arranged to provide a current path for the ESD pulse between the diode and a particular bipolar transistor from the series stack, therein lowering the snapback holding voltage.

2. The apparatus of claim 1, wherein the bipolar transistors of the series stack are PNP bipolar transistors, and wherein an anode of the diode is coupled to a collector of the particular bipolar transistor and a cathode of the diode is coupled to the second node, and the shunted current from the ESD pulse initially flows sequentially through the series stack of bipolar transistors and through the diode.

3. The apparatus of claim 2, further comprising a conductive trace connecting the anode of the diode to the collector of the particular bipolar transistor from the series stack, wherein the ESD pulse initially flows from the collector of the particular bipolar transistor to the anode of the diode, and the current path is between an emitter of the particular bipolar transistor and the cathode of the diode.

4. The apparatus of claim 3, wherein the first circuit is configured to shunt current between the first and second nodes using the current path that bypasses an emitter to collector junction of the particular bipolar transistor.

5. The apparatus of claim 3, further comprising a gap that physically separates an emitter of the particular bipolar transistor from a base of the particular bipolar transistor and that is configured to reduce the snapback holding voltage.

6. The apparatus of claim 2, wherein a particular PNP bipolar transistor takes up an area that is less than one half of an area of another PNP bipolar transistor in the series stack.

7. The apparatus of claim 1, wherein each bipolar transistor in the series stack includes a physical gap between a respective emitter and base, and wherein the gap reduces the snapback holding voltage.

8. The apparatus of claim 1, wherein the series stack of bipolar transistors includes three PNP bipolar transistors and wherein the snapback holding voltage exceeds 30 volts.

9. The apparatus of claim 8, wherein the first circuit is configured to operate with a trigger voltage that is about 39 volts.

10. The apparatus of claim 1, wherein the series stack of bipolar transistors includes four PNP bipolar transistors and wherein the snapback holding voltage exceeds 30 volts the first circuit is configured to operate with a trigger voltage that is between 40 and 50 volts.

11. The apparatus of claim 1, wherein the series stack of bipolar transistors includes two PNP bipolar transistors and wherein the snapback holding voltage is between 20 and 25 volts.

12. The apparatus of claim 1, further comprising at least one additional diode in a series connection with the diode connected in series with the stack of bipolar transistors and wherein a trigger voltage is above 30V.

13. The apparatus of claim 1, wherein each bipolar transistor in the series stack does not include a physical gap between a respective emitter and base.

14. A method for use with an electrostatic discharge (ESD) protection circuit, the method comprising:
receiving an ESD pulse on a first node;
passing, in response to the ESD pulse and the ESD protection circuit being in an off-state, a trigger current through a trigger path within the ESD protection circuit that includes a series stack of bipolar transistors and a diode that is connected in series with the series stack of bipolar transistors;
transitioning, in response to the trigger current, the ESD protection circuit to an on-state by enabling an embedded silicon controlled rectifier (eSCR) component that includes a combination of a particular bipolar transistor from the series stack of bipolar transistors and the diode; and
shunting, in response to transitioning to the on-state, current from the ESD pulse through a current path between the particular bipolar transistor from the series stack of bipolar transistors and the diode.

15. The method of claim 14, wherein the particular bipolar transistor and the diode are respectively connected in series, and wherein the trigger path includes:
a portion that passes through an n-type well region and is from an emitter of the particular bipolar transistor to a collector of the particular bipolar transistor, and
a portion that connects the collector of the particular bipolar transistor to an anode of the diode.

16. The method of claim 14, wherein the shunting includes shunting the current through an eSCR current path that passes through an n-type well region and is from an emitter of the particular bipolar transistor to the cathode of the diode, thereby lowering a snapback holding voltage of the first circuit when shunting current between the first and second nodes.

17. The method of claim 14, wherein the bipolar transistors of the series stack of bipolar transistors are PNP transistors.

18. The method of claim 14, wherein the transitioning to the on-state further includes inducing avalanche breakdown in the series stack of bipolar transistors.

19. The method of claim 14, wherein the transitioning to the on-state further includes reducing a voltage across the ESD protection circuit to a snapback holding voltage.

20. The method of claim 14, further comprising preventing DC breakdown from bases of the series stack of bipolar transistors to a substrate using a P+ region that surrounds bases of the series stack of bipolar transistors.

* * * * *